United States Patent [19]
Banik et al.

[11] Patent Number: 5,559,745
[45] Date of Patent: Sep. 24, 1996

[54] STATIC RANDOM ACCESS MEMORY SRAM HAVING WEAK WRITE TEST CIRCUIT

[75] Inventors: Jashojiban Banik; Anne Meixner; Glenn F. King, all of Aloha; Doug Guddat, Portland, all of Oreg.

[73] Assignee: Intel Corporation, Santa Clara, Calif.

[21] Appl. No.: 529,016

[22] Filed: Sep. 15, 1995

[51] Int. Cl.⁶ .............................. G11C 7/00; G11C 29/00
[52] U.S. Cl. ...................... 365/201; 365/203; 365/204; 365/205; 371/21.1
[58] Field of Search .................................. 365/201, 203, 365/204, 205

[56] References Cited

U.S. PATENT DOCUMENTS

| | | | |
|---|---|---|---|
| 4,956,819 | 9/1990 | Hoffmann et al. | 365/201 |
| 4,958,324 | 9/1990 | Devin | 365/201 |
| 4,999,813 | 3/1991 | Ohtsuka et al. | 365/201 |
| 5,255,230 | 10/1993 | Chan et al. | 365/201 |

*Primary Examiner*—David C. Nelms
*Assistant Examiner*—Trong Phan
*Attorney, Agent, or Firm*—Blakely, Sokoloff, Taylor & Zafman

[57] ABSTRACT

A test circuit and method for testing a memory cell in a static random access memory. The memory cell is coupled to a bit line and a complementary bit line. The test circuit includes a charging device coupled to selectively charge one of the bit line or the complementary bit line and a discharging device coupled to selectively discharge the other of the bit line and the complementary bit line. To test a memory cell containing the first value, the test circuit performs a weak write of the second value to the memory cell. The weak write overwrites the first value contained in the memory cell with the second value if the memory cell is defective. The memory cell retains the first value if functioning properly.

16 Claims, 4 Drawing Sheets

5,559,745

STATIC RANDOM ACCESS MEMORY SRAM HAVING WEAK WRITE TEST CIRCUIT

FIELD OF THE INVENTION

The present invention pertains to the field of integrated circuit memory devices. More particularly, this invention relates to circuits for testing memory cells in integrated circuit memory devices.

BACKGROUND

A prior static random access memory (SRAM) comprises an array of SRAM cells. Each SRAM cell is capable of storing a logical value using a pair of cross coupled devices such as inverters. Pullup gates in the cross coupled devices usually prevent leakage currents in the cell from discharging the internal data storage nodes of the cell.

Such an SRAM is typically implemented on an integrated circuit die according to a process technology that forms semiconductor and metal structures onto the integrated circuit die. The semiconductor structures usually include diffusion regions and polysilicon structures for the transistors in the SRAM. The metal structures often provide electrical interconnection between the transistors and other devices in the SRAM.

Such an integrated circuit process technology typically forms a plurality of contacts within each SRAM cell. Such contacts include contacts formed involving metal interconnect structures, polysilicon structures, and the diffusion regions of the transistors of the SRAM cell.

Defects sometimes occur in the semiconductor and metal structures of an integrated circuit during such a manufacturing process. Such manufacturing defects can cause failures in the contacts in the SRAM cells or in the individual transistors in the SRAM cells. A symmetric defect impairs the performance of both of the cross coupled devices of the cell. A defective contact in a power supply line which normally supplies power to the entire memory cell is considered a symmetric defect since both cross coupled devices are left without power. On the other hand, an asymmetric defect normally impairs only one of the cross coupled devices. A defective pullup in one inverter is an example of an asymmetric defect.

Manufacturing quality testing procedures are provided to detect such defects in newly manufactured integrated circuits. During a common manufacturing quality test procedure, the integrated circuits are placed in a highly specialized integrated circuit tester. Such a tester usually tests an SRAM by writing a predetermined data pattern to the SRAM cells and then immediately reading the SRAM cells to verify the stored data pattern. If the data written to the SRAM does not match the data read from the SRAM, then the SRAM is usually deemed defective.

Unfortunately, such a test procedure typically does not detect manufacturing defects that cause data retention problems in the SRAM cells. That is, defects that only show up after a cell has retained data for a relatively long period of time. For example, an SRAM cell having a defective pullup transistor at an internal data storage node retains stored charge for only a short period of time. The charge stored at the storage nodes of such an SRAM cell usually discharges through the diffusion regions of the transistors of the SRAM cell. A defective pullup transistor usually cannot maintain the charge level at the storage node for a long time.

One prior method for detecting such data retention defects is to provide a tester delay interval long enough to allow such a defective SRAM cell to discharge. That is, to increase the delay interval between the write of the test data pattern to the SRAM and the subsequent read-verify of the SRAM. Unfortunately, such tester delays significantly increase the time required for testing each integrated circuit. Consequently, more integrated circuit testers are necessary to obtain a certain throughput of integrated circuits when a data retention test including such a delay interval is used. The increased need for the extremely expensive integrated circuit testers results in a great increase in manufacturing costs.

One technique to avoid this cost is to include an on chip testing circuit to stress each SRAM cell. One such circuit is disclosed in copending application 08/277,148 filed Jul. 19, 1994 entitled "Memory Circuit with Stress Circuitry for Detecting Defects" which is assigned to the present assignee. This copending application discloses a circuit which stresses a memory cell using a pulldown transistor coupled to each bit line of the memory cell.

SUMMARY

A test circuit for use in a static random access memory (SRAM) is described. The SRAM has at least one memory cell capable of storing either a first value or a second value. The memory cell is coupled to a bit line and a complementary bit line. The test circuit comprises a charging device coupled to charge either the bit line or the complementary bit line, and a discharging device coupled to discharge either the bit line or the complementary bit line. When the test circuit tests a memory cell containing the first value, the charging device charges the bit line, and the discharging device discharges the complementary bit line. This charging and discharging causes a weak write of the second value to the memory cell, overwriting the first value contained in the memory cell with the second value if the memory cell is defective. The memory cell retains the first value if the memory cell is functioning properly.

The test circuit may additionally test a memory cell containing the second value. In this case, the test circuit causes a weak write of the first value to the memory cell, overwriting the second value if the memory cell is defective. The second value is retained if the memory cell is properly functioning.

DETAILED DESCRIPTION

A weak write circuit for testing memory cells is described. In the following description, numerous specific details are set forth, such as device technologies and signaling nomenclature, in order to provide a thorough understanding of an embodiment of the present invention. It will be apparent to those skilled in the art that the present invention may be practiced without these specific details.

Figure 1:
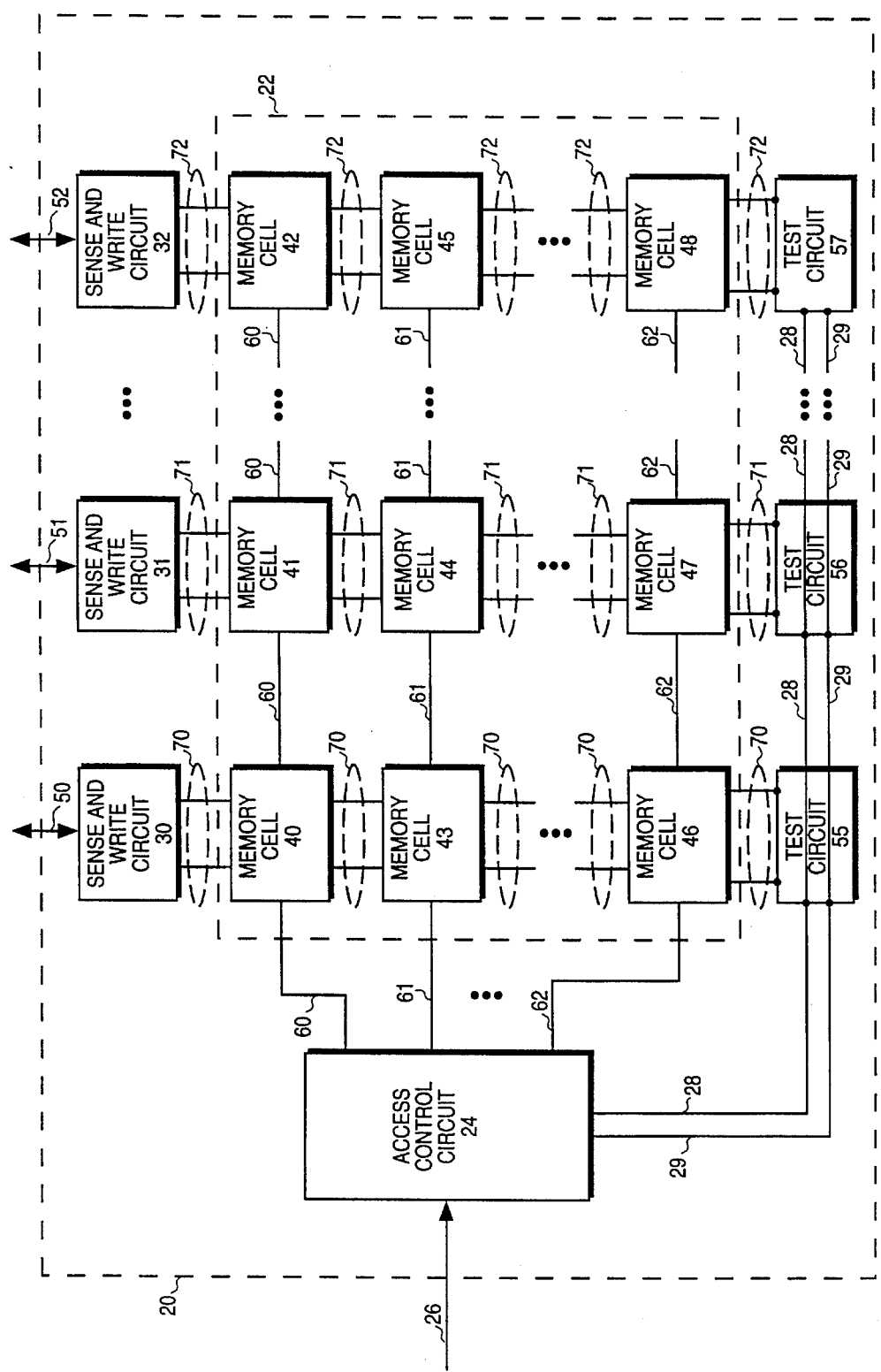
FIG. 1 is a schematic representation of a static random access memory of one embodiment of the present invention.

FIG. 1 illustrates one embodiment of a static random access memory (SRAM) 20. The SRAM 20 comprises an access control circuit 24, a plurality of sense and write circuits 30–32, and a memory cell array 22. The memory cell array 22 comprises a plurality of memory cells 40–48. The SRAM 20 further comprises a plurality of weak write test circuits 55–57, one associated with each column of memory cells.

The access control circuit 24 drives a plurality of word lines 60–62 of the memory cell array 22. The access control circuit 24 drives the word lines 60–62 to perform read and write operations to the memory cells 40–48 as is well known in the art.

Each word line 60–62 corresponds to a row of the memory cell array 22. For example, the word line 60 corresponds to a row of the memory cell array 22 comprising the memory cells 40–42. Similarly, the word line 61 corresponds to a row of the memory cell array 22 comprising the memory cells 43–45, and the word line 62 corresponds to a row comprising the memory cells 46–48.

The sense and write circuits 30–32 are coupled to the bit lines 70–72 of the memory cell array 22. The sense and write circuits contain operational write circuits and sense amplifiers. The sense amplifiers differentially sense data on the bit lines 70–72 during read operations, and the operational write circuits drive data onto the bit lines 70–72 during write operations to the memory cell array 22. The sense and write circuits 30–32 also perform precharge operations that precharge the bit lines 70–72 to a predetermined voltage level. Well known circuits may be used for the sense and write circuits 30–32.

The bit lines 70–72 each comprise a pair of bit lines for a corresponding column of the memory cell array 22. For example, the bit lines 70 are coupled to a column of the memory cell array 22 comprising the memory cells 40, 43, and 46. Similarly, the bit lines 71 are coupled to a column comprising the memory cells 41, 44, and 47, and the bit lines 72 are coupled to a column comprising the memory cells 42, 45, and 48.

As taught by the present invention, the access control circuit 24 enables weak write tests on the memory cell array 22 using weak write control signals provided on a plurality of weak write control lines 28–29. A weak write test comprises a series of write, weak write, read-verify cycles performed row by row on the memory cell array 22. A write "0", weak write "1", read-verify "0" series verifies the capability of the memory cells 40–48 to retain a "0". A write "1", weak write "0", read-verify "1" series verifies the capability of the memory cells 40–48 to retain a "1".

The weak write control signals are inactive during normal read and write cycles to the memory cell array 22, thereby maintaining the test circuits 55–57 inactive. The inactive test circuits 55–57 present relatively small capacitive loads and have minimal impact on the normal operation of the memory cell array 22. The capacitance of the bit lines 70–72 is relatively large compared to the test circuits 55–57 because a large number of memory cells are often coupled to each pair of the bit lines 70–72.

During a write cycle to the SRAM 20, the access control circuit 24 receives an address over an address bus 26, and the sense and write circuits 30–32 receive data over a plurality of data lines 50–52. Each sense and write circuit 30–32 receives a data bit over the corresponding data line 50–52. For example, the sense and write circuit 30 receives a data bit over the data line 50, the sense and write circuit 31 receives a data bit over the data line 51, and the sense and write circuit 32 receives a data bit over the data line 52.

The operational write circuits included in sense and write circuits 30–32 drive the received data onto the bit lines 70–72. The access control circuit 24 drives one of the word lines 60–62 according to the address received over the address bus 26 during the write operation. The activated word line 60–62 determines the row of the memory cell array 22 that is written with the data using decoding techniques well known in the art.

During a read cycle on the SRAM 20, the access control circuit 24 receives an address over the address bus 26. The access control circuit 24 decodes the received read address, and drives the appropriate word line 60–62. The activated word line 60–62 causes the corresponding row of the memory cell array 22 to drive data onto the bit lines 70–72. The sense amplifiers included in sense and write circuits 30–32 each detect a voltage differential on the corresponding bit lines 70–72 and amplify the voltage differential. The sense and write circuits 30–32 then drive the sensed data from the memory cell array 22 over the data lines 50–52 as is well known in the art.

Figure 2:
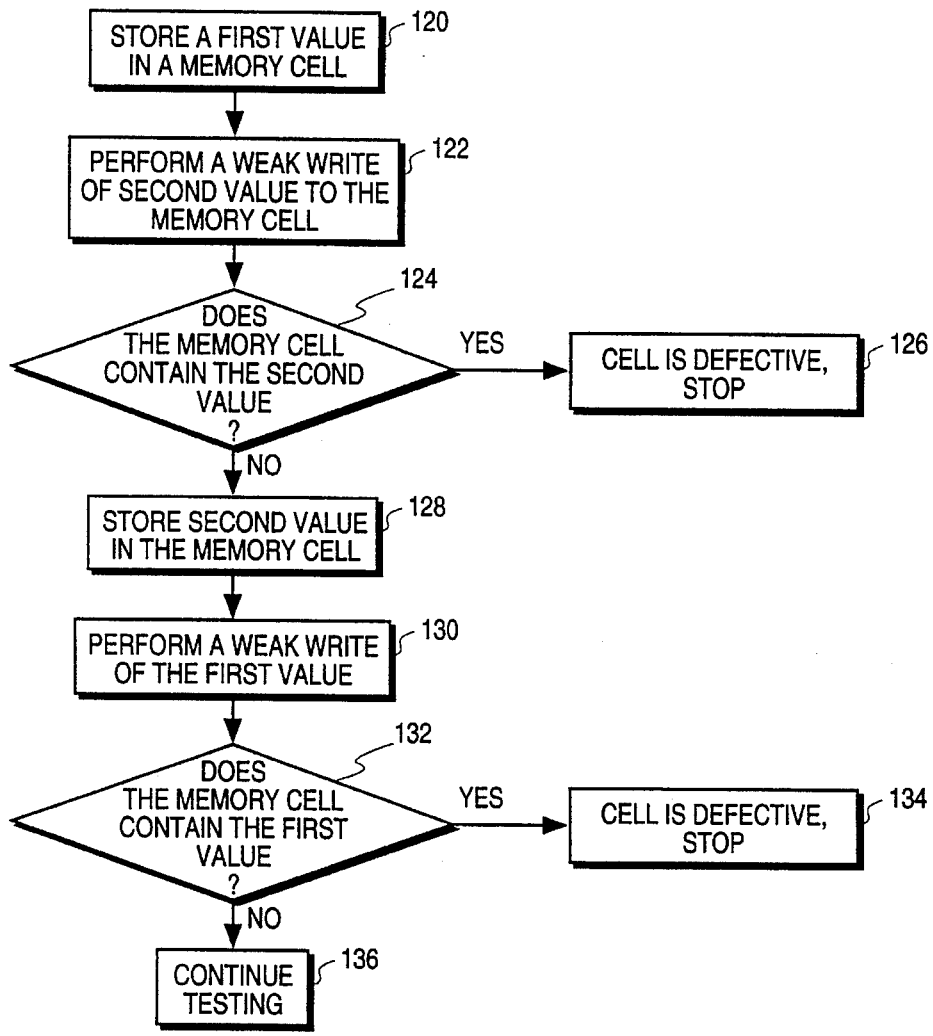
FIG. 2 is a flow diagram illustrating a method of testing a memory cell using a test circuit of one embodiment of the present invention.

A method of testing a memory cell of an SRAM in accordance with the present invention is illustrated in flowchart form in FIG. 2. Prior to a first weak write cycle on the SRAM 20, in a step 120, a first value (e.g. a binary 0, "0") is written to the memory cell, providing a first stored state. This value will typically be written to an entire selected row or the entire memory cell array 22. During the weak write cycle on the SRAM 20, the access control circuit 24 receives a weak write address over the address bus 26. The access control circuit 24 decodes the received weak write address, and drives the appropriate word line 60–62.

In a step 122, the access control circuit 24 causes a weak write cycle of a second value (e.g. a binary 1, "1") to the memory cell via a weak write control signal. The weak write control signal, which is provided on one of the weak write control lines 28–29, activates the test circuits 55–57. The test circuits 55–57 couple complementary voltages to each pair of the bit lines 70–72. For the memory cells in the selected row of the memory cell array 22, these complementary voltages attempt to change the first stored state.

In a step 124, results of a read-verify operation are tested. If the memory cell contains the second value, the weak write has overwritten the prior contents, indicating an unacceptably weak cell. Consequently, the cell is deemed defective and the test stopped as indicated in a step 126. Similarly to the steps 120 and 122, the read-verify stage is often performed on multiple memory cells simultaneously.

Once a cell is deemed defective, testing is usually stopped for both that test and the entire memory cell array. Often, one defective cell indicates that the whole SRAM cannot be used, making further testing a waste of valuable tester time. In other cases, such as a SRAM with redundant cells, it may be desirable to continue testing the entire array, keeping track of any defective cells found.

If the memory cell has retained the first value, a second weak write cycle is usually used. In a step 128, a second value is written to the memory cell. The test circuits 55–57 apply a weak write of the first value applied in a step 130. If the memory cell contains the first value, as tested in a step 132, the cell is deemed defective and the test is stopped in a step 134. Otherwise, testing may be continued as illustrated in a step 136. Depending on details of a comprehensive test program for the SRAM 20, this testing method may conclude testing on the SRAM 20 or may be followed by other tests.

Figure 3:
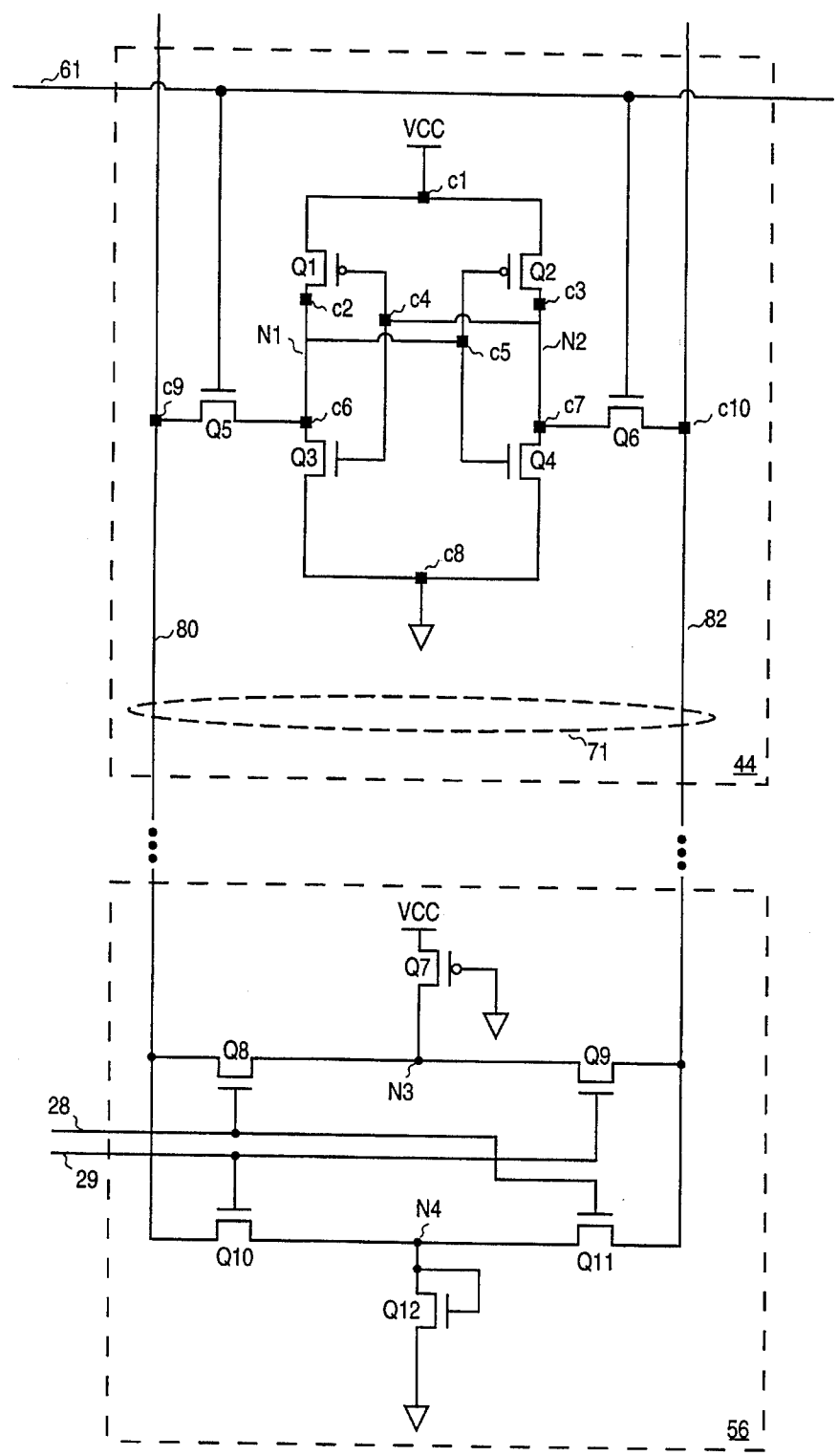
FIG. 3 is a detailed circuit schematic of a memory cell and a test circuit for one embodiment of the present invention.

FIG. 3 illustrates the memory cell 44 and the test circuit 56 for one embodiment. The memory cells 40–43, and 45–48 may be identical to the memory cell 44. The memory cell 44 comprises a plurality of transistors Q1–Q6. The transistors Q1–Q4 are arranged as cross coupled inverters. A first inverter is formed by the transistors Q1 and Q3. A second inverter is formed by the transistors Q2 and Q4. Flaws reducing the strength of pullup transistors such as the transistors Q1 and Q2 are one potential source of data retention defects.

The bit lines 71 comprise a bit line 80 and a complementary bit line 82. The transistor Q5 is a pass gate that connects an internal node N1 to the bit line 80. Similarly, the transistor Q6 is a pass gate that connects an internal node N2 to the bit line 82. The transistors Q5 and Q6 are activated via the word line 61.

A plurality of contacts c1–c10 include diffusion regions, polysilicon structures, and/or metal interconnect structures of the integrated circuit die that contains the SRAM 20. These contacts are another source of defects in the cells. Defective contacts may fail to provide a connection between the integrated circuit structures or may provide a highly resistive connection compared to other contacts.

The test circuit comprises a plurality of transistors Q7–Q12. The transistor Q7 is a pullup or charging device with a source coupled to a pullup voltage (Vcc), a drain coupled to a node N3, and a gate coupled to a bias voltage. As illustrated, the transistor Q7 is a P channel MOS transistor having a gate coupled to a Vss potential (ground). A bias voltage other than Vss could provide a different pullup characteristic for the pullup device.

The transistor Q12 is a pulldown or discharging device with a source coupled to a pulldown voltage (Vss or ground) and a gate and drain coupled to a node N4. In this configuration, the transistor Q12 is an N channel MOS transistor configured as a diode such that it becomes conductive when a voltage present on the node N4 exceeds a threshold voltage of the transistor Q12. Alternately, the gate of the transistor Q12 could be detached from the drain and instead coupled to a bias voltage, allowing a different pulldown characteristic for the pulldown device.

The transistors Q8–Q11 are pass gates. The transistor Q8 selectively couples the node N3 to the bit line 80 according to the weak write control signal 28. The transistor Q9 selectively couples the node N3 to the bit line 82 according to the weak write control signal 29. The transistor Q10 selectively couples the node N4 to the bit line 80 according to the weak write control line 29, and the transistor Q11 selectively couples the node N4 to the bit line 82 according to the weak write control line 28. The weak write control signals provide ordinary binary signals that cause the transistors Q8–Q11 to conduct or not conduct.

During a first weak write cycle, a weak write "0", the access control circuit 24 provides an active weak write control signal on the weak write control line 29. The active weak write signal switches on the transistors Q9 and Q10. The current through the transistor Q7 charges the bit line 82 through the pass gate Q9. The transistor Q12 discharges the voltage on the bit line 80 through the pass gate Q10. The access control circuit 24 also activates the word line 61 during the weak write cycle on the memory cell 44, switching on the transistors Q5 and Q6. The signal on the control line 28 remains low, and the transistors Q8 and Q11 remain off.

Figure 4:
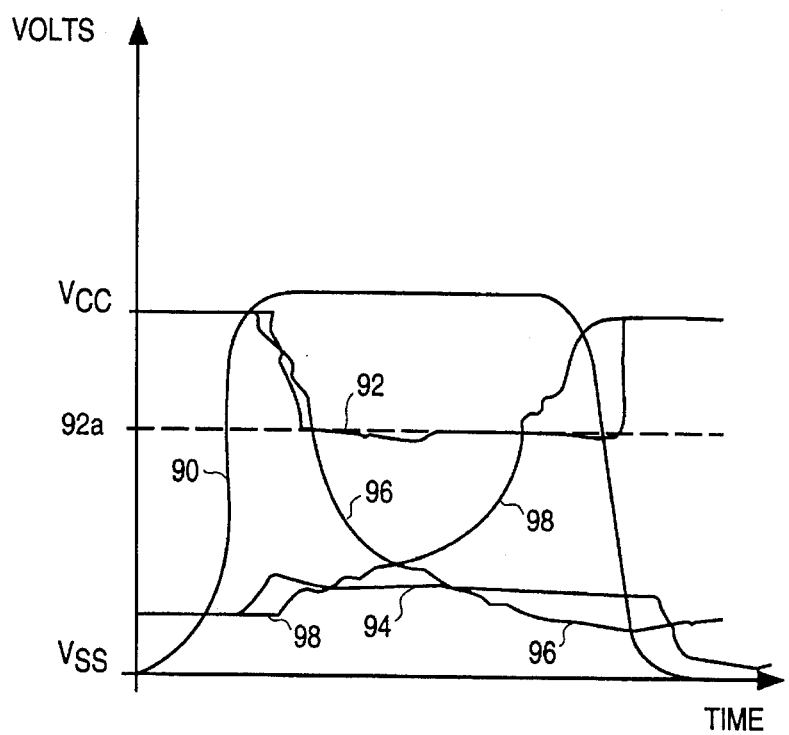
FIG. 4 is a timing diagram illustrating a weak write cycle.

FIG. 4 illustrates a plurality of voltage waveforms 90–94 occurring during a weak write "0" test. Assume that a "1" (high voltage level) is stored at the internal node N1 at the start of the weak write cycle. Consider the waveform 92 as the voltage from the internal node N1. Assume also that the memory cell 44 is functioning properly. The weak write control signal is a weak write pulse active for a pulse duration as indicated by the waveform 90.

This duration is typically determined empirically during the design of the weak write circuit. While overall test time may be reduced by using a minimal pulse length, the weak write circuit can also operate with different test times. A longer duration can be used to provide an extended weak write cycle since an activated weak write circuit provides a substantially constant stress on the memory cell. At the expense of increased test time, an extended weak write cycle typically increases the detection of data retention defects. To accommodate several possible weak write test times, the access control circuit may be designed to allow test duration adjustment at test time or test duration selection from a plurality of durations.

During the pulse duration, the pulldown transistor Q12 pulls down the voltage on the bit line 80 through the pass gate Q10. The pass gate Q5 enables a path such that the pulldown transistor Q12 also attempts to pull down the voltage at the internal node N1; however, the pullup transistor Q1 is in contention with the pulldown transistor Q12.

Similarly, the pullup transistor Q7 pulls up the voltage on the bit line 82 through the pass gate Q9. The pass gate Q6 enables a path such that the pullup transistor Q7 attempts to pull up the voltage at the internal node N2; however, in this case the pullup transistor Q7 is in contention with the pulldown transistor Q4. The resulting voltage response is illustrated by a waveform 94. Since the cell is functioning properly, the pulldown transistor Q4 maintains a low enough voltage on node N2, and the pullup transistor Q1 is able to sustain a high enough voltage on node N1 to prevent the weak write cycle from overwriting (or flipping) the stored "1".

FIG. 4 also illustrates voltage waveforms for a defective memory cell 44 undergoing a weak write "0" test. In this case, the voltage on the node N1 is illustrated by a waveform 96, and the voltage on the node N2 is illustrated by a waveform 98. Assume that a "1" is again stored at the internal node N1 at the start of the weak write cycle. Assume also that the memory cell has an asymmetric defect, one affecting only one inverter of the memory cell 44. Consider an asymmetric defect affecting the first inverter such as contact c2 being defective or transistor Q1 being defective or having too high of a resistance. Through the pass gate Q10, the transistor Q12 pulls down the voltage on the bit line 80. The enabled pass gate Q5 connects the transistor Q12 in contention with the transistor Q1 of the first inverter.

Since the memory cell is defective, the pulldown transistor Q12 overcomes the pullup transistor Q1. The voltage at the internal node N1 follows a declining voltage on the bit line 80. The declining voltage on the internal node N1 degrades the current drive capability of the transistor Q4. At the same time, pullup transistor Q7 pulls up the node N2 through the transistors Q6 and Q9. The reduced current drive capability of the transistor Q4 and the pullup transistor Q7 cause the voltage at the internal node N2 to rise rather than maintain the normal low level voltage.

As the voltage at the internal node N2 reaches the transistor threshold voltage ($V_{tn}$), the transistor Q3 switches on and begins conducting. The conducting transistor Q3 further lowers the voltage at the internal node N1. Without the pullup transistor Q1 operating effectively, the voltage at the internal node N1 declines sufficiently to flip the state stored in the memory cell 44.

Thereafter, during the read-verify cycle on the memory cell 44, a "0" is read from the memory cell 44 where a "1" was originally written.

A second weak write cycle, a weak write "1", applied to memory cell 44 tests for an asymmetric failure involving transistor Q2 or contact c3. Prior to the second stress cycle, a "1" is stored at the internal node N2. A weak write pulse on the weak write control line 28 activates the transistors Q8 and Q11 while the transistors Q5 and Q6 are also activated. This time, the transistors Q9 and Q10 are off. If the transistor Q2 or the contact c3 is defective, the pulldown transistor Q12 and the pullup transistor Q7 will flip the state of the memory cell such that a "0" overwrites the "1" previously stored at the internal node N2. The flipping from "1" to "0" of the node N2 is detected during a subsequent read-verify cycle.

A symmetric failure occurs in the memory cell 44 if the contact c1 or the contact c8 is defective. Under such conditions, both the weak write "0" and the weak write "1" tests fail (i.e. the value first stored is overwritten). The weak write tests apply complementary voltages to the internal nodes N1 and N2, forcing the pair of cross coupled inverters into a state which usually can be reliably detected. From this state, the sense amplifiers can usually sense a voltage differential even if a defective contact reduces the charging or discharging of current through the transistors Q1–Q4.

The prior art circuit of the previously mentioned copending application attempts to pull down both bit lines to the same voltage level. This discharges both internal nodes in a memory cell such as the nodes N1 and N2 of memory cell 44. In a cell with a symmetric defect, this results in a state which is generally more difficult to reliably detect than the state which occurs when a weak write circuit is used.

Thus, the application of complementary voltages of the weak write technique of the present invention provides better reliability. Further, the weak write technique allows symmetric and asymmetric failures to be distinguished. An asymmetric defect in an SRAM cell should only fail one of the weak write tests, whereas a symmetric failure should fail both. This increased reliability and ability to characterize failures requires only the addition of four transistors per bit line pair when compared to the prior art circuit.

In view of the configuration and operation of the test circuit described above, the following considerations will enable one skilled in the art to provide a test circuit with proper transistor sizing. The proper sizing required for the pullup transistor Q7 and the pulldown transistor Q12 depends upon many factors including the size of the memory cell array 22, the strength of the transistors Q1–Q4 comprising the cross coupled inverters, the size of the pass gates Q5–Q6 and Q8–Q11, and the duration of the weak write pulse.

The pulldown and pullup device sizes in the weak write circuit are chosen such that a weak write operation does not flip a properly functioning memory cell but does flip a cell with a data retention defect. When a weak write "0" is performed in an attempt to overwrite the content of the cell, the transistor Q12 discharges the bit line 80, and the transistor Q7 charges bit line 82. In the beginning of this weak write, the transistor Q12 is in contention with the transistor Q1, and the transistor Q7 is in contention with the transistor Q4.

During a normal write operation, the operational write drivers are strong enough to override a value stored in a memory cell by charging and discharging the bit lines with the opposite value. In contrast, during a weak write operation, the transistors Q12 and Q7 charge and discharge the bit lines only to an extent which flips a defective memory cell but does not flip a properly functioning memory cell. The properly functioning memory cell has strong enough contending devices to retain its original state even after the weak write operation. Thus, the weak write circuit transistor sizes can be chosen according to the characteristics of the memory device being tested.

The present weak write circuit provides testing for both symmetric and asymmetric defects in a SRAM. While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. In a static random access memory having at least one memory cell capable of storing either a first value or a second value where the memory cell contains the first value, the memory cell being coupled to a bit line and a complementary bit line, a test circuit comprising:

a charging device coupled to charge either the bit line or the complementary bit line;

a discharging device coupled to discharge either the bit line or the complementary bit line, the charging device charging the bit line, and the discharging device discharging the complementary bit line causing a weak write of the second value to the memory cell, the weak write overwriting the first value contained in the memory cell with the second value if the memory cell is defective, the memory cell retaining the first value if the memory cell is functioning properly.

2. The test circuit of claim 1 wherein the charging device and the discharging device are enabled for a pulse duration selected from a plurality of durations.

3. The test circuit of claim 1 wherein the charging device is a first transistor coupled to a pullup voltage, the first transistor having a gate biased with a first bias voltage, and the discharging device is a second transistor coupled to a pulldown voltage, the second transistor having a second gate biased with a second bias voltage, the first bias voltage and the second bias voltage being set to allow the memory cell to retain the first value if the memory cell is functioning properly.

4. The test circuit of claim 3 wherein the first bias voltage is a Vss potential, and the second bias voltage is set by coupling the second gate of the second transistor to a drain of the second transistor.

5. The test circuit of claim 1 wherein the discharging device is a diode.

6. The test circuit of claim 5 wherein the diode is formed by an N channel MOS transistor having a gate and a drain, the gate being coupled to the drain.

7. In a static random access memory having at least one memory cell capable of storing either a first value or a second value where the memory cell contains the first value, the memory cell having a first inverter and a second inverter driving a first storage node and a second storage node, the first storage node being selectably coupled to a first bit line, and the second storage node being selectably coupled to a second bit line, a weak write circuit comprising:

a pullup transistor coupled to the first bit line, the pullup transistor pulling up the first bit line in contention with the first inverter in response to a first control signal; and a pulldown transistor coupled to the second bit line, the pulldown transistor pulling down the second bit line in contention with the second inverter in response to the first control signal, the memory cell retaining the first value if the memory cell is functioning properly.

8. The weak write circuit of claim 7 wherein the pullup transistor is coupled to pull up the second bit line in contention with the second inverter in response to a second control signal, and the pulldown transistor is coupled to pull down the first bit line in contention with the first inverter in response to the second control signal.

9. The weak write circuit of claim 7 wherein the pullup transistor is coupled to a pullup voltage and has a gate biased with a first bias voltage, and the pulldown transistor is coupled to a pulldown voltage and has a second gate biased with a second bias voltage, the first bias voltage and the second bias voltage being set to allow the memory cell to retain the first value if the memory cell is functioning properly.

10. In a static random access memory having at least one memory cell, a bit line, and a complementary bit line, a test circuit comprising:

a pulldown device;

a pullup device;

a first pass gate coupling the bit line to the pullup device, the first pass gate having a first control terminal coupled to receive a first control signal;

a second pass gate coupling the pulldown device to the complementary bit line, the second pass gate having a second control terminal coupled to receive the first control signal;

a third pass gate coupling the complementary bit line to the pullup device, the third pass gate having a third control terminal coupled to receive a second control signal; and a fourth pass gate coupling the pulldown device to the bit line, the fourth pass gate having a control terminal coupled to receive the second control signal.

11. The test circuit of claim 10 further comprising an access control circuit capable of providing either of the first control signal to enable the first and second pass gates or the second control signal to enable the third and fourth pass gates.

12. The test circuit of claim 10 wherein the pulldown device is a diode.

13. The test circuit of claim 10 wherein the pulldown device is an N channel transistor having a source coupled to a pulldown voltage, a drain coupled to the second and fourth pass gates, and a gate coupled to the drain.

14. A static random access memory comprising:

a memory cell capable of storing one of a first value or a second value;

an access control circuit coupled to the memory cell for enabling access to the memory cell;

an operational write circuit for storing one of the first value or the second value in the memory cell during normal operation;

a first weak write circuit for testing the memory cell if the memory cell contains the first value, the first weak write circuit providing a weak write of the second value to the memory cell, the memory cell retaining the first value if the memory cell is functioning properly;

a second weak write circuit for testing the memory cell if the memory cell contains the second value, the second weak write circuit providing a second weak write of the first value to the memory cell, the memory cell retaining the second value if the memory cell is functioning properly; and a sense amplifier for reading the memory cell to determine which of the first value and the second value the memory cell contains.

15. A method of testing a memory array in a static random access memory, the memory array having at least one memory cell, the memory cell being capable of storing a state of either a first value or a second value, comprising the steps of:

storing the first value in the memory cell;

coupling complementary voltages to the memory cell providing a weak write of the second value to the memory cell;

sensing the state of the memory cell to determine if the state changed;

if the memory cell contains the second value, indicating that the memory cell is defective; and if the memory cell contains the first value, continuing testing the memory cell.

16. The method of claim 15 wherein the step of continuing comprises the steps of:

storing the second value in the memory cell;

coupling complementary voltages to the memory cell providing a weak write of the first value to the memory cell, the weak write overwriting the second value contained in the memory cell with the first value if the memory cell is defective; and if the memory cell contains the second value, indicating that the memory cell is defective.

* * * * *